(12) United States Patent
Yoshihisa et al.

(10) Patent No.: US 8,344,458 B2
(45) Date of Patent: Jan. 1, 2013

(54) SEMICONDUCTOR DEVICE

(75) Inventors: Yasuki Yoshihisa, Kanagawa (JP); Kikuo Kato, Kanagawa (JP); Tetsuya Nitta, Kanagawa (JP); Kazuma Onishi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/110,630

(22) Filed: May 18, 2011

(65) Prior Publication Data

US 2011/0284987 A1 Nov. 24, 2011

(30) Foreign Application Priority Data

May 19, 2010 (JP) .................................. 2010-115088

(51) Int. Cl.
*H01L 23/62* (2006.01)
(52) U.S. Cl. ....................................................... 257/355
(58) Field of Classification Search .................... 257/355
See application file for complete search history.

(56) References Cited

U.S. PATENT DOCUMENTS

| 7,880,262 B2 | 2/2011 | Yamamoto |
| 2012/0139087 A1* | 6/2012 | Yoshihisa et al. ............. 257/618 |

FOREIGN PATENT DOCUMENTS

| JP | 9-298277 | 11/1997 |
| JP | 2009-177087 | 8/2009 |

* cited by examiner

*Primary Examiner* — Bradley K Smith
(74) *Attorney, Agent, or Firm* — McDermott Will & Emery LLP

(57) ABSTRACT

There is provided a semiconductor device capable of suppressing malfunction of an element to be protected, caused by electrons from an output element into a semiconductor substrate. The semiconductor device is provided with the semiconductor substrate, the output element, the element to be protected, a tap part, and a first active-barrier structure. The first active-barrier structure is disposed between the element to be protected and the tap part. Further, the first active-barrier structure includes an n-type region joined with a p-type doped region, and a p-type region in ohmic coupling with the n-type region.

10 Claims, 15 Drawing Sheets

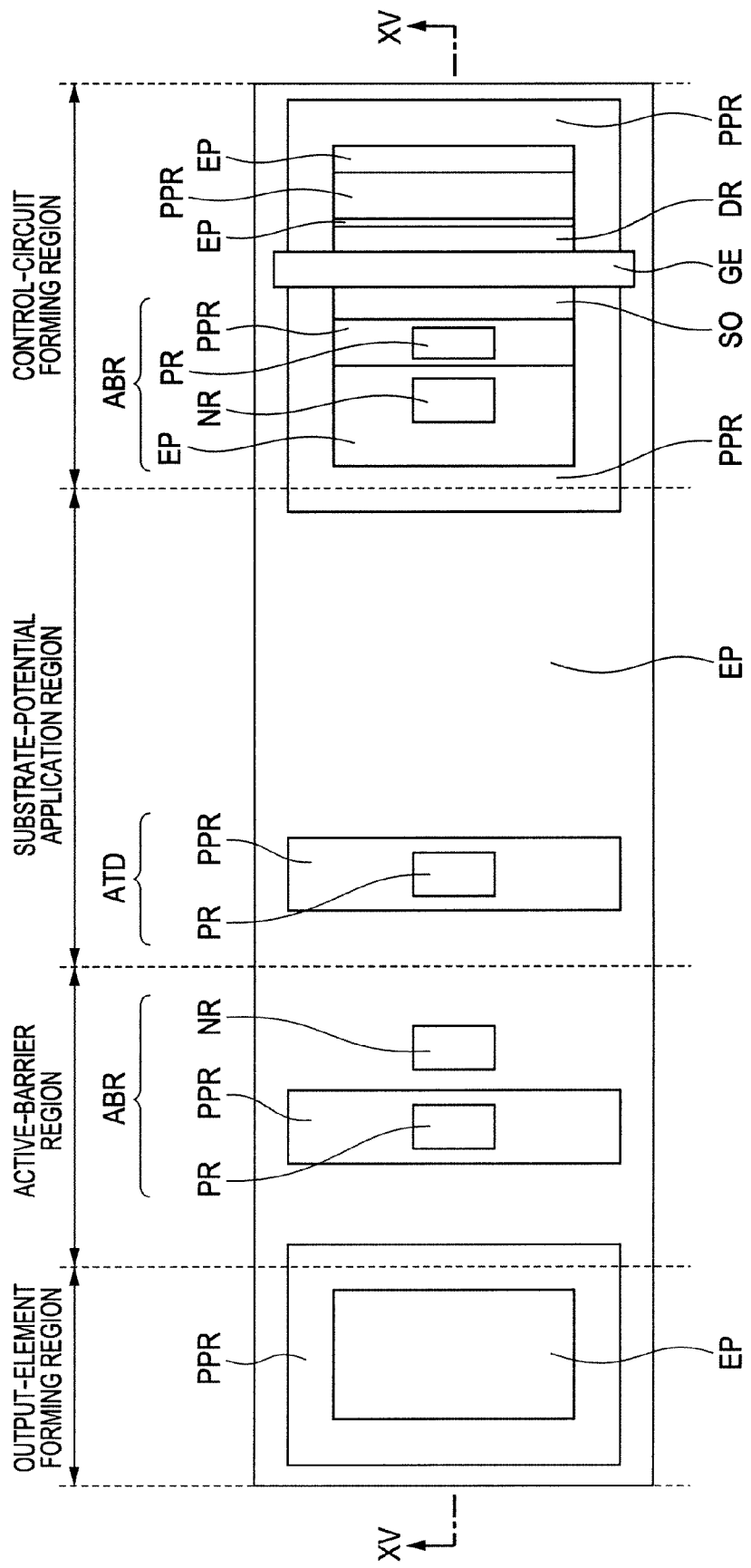

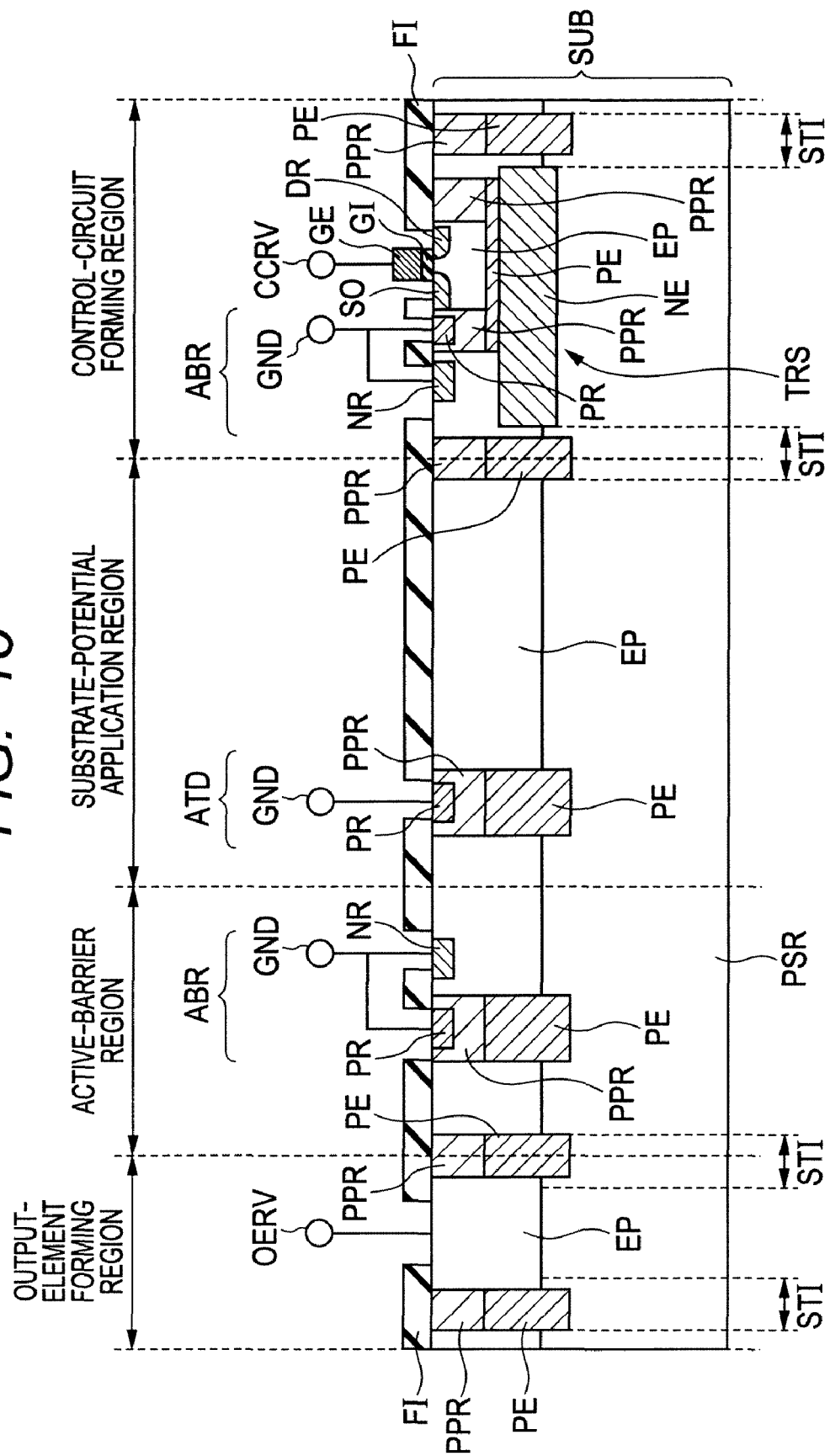

SEMICONDUCTOR DEVICE

CROSS-REFERENCE TO RELATED APPLICATIONS

The disclosure of Japanese Patent Application No. 2010-115088 filed on May 19, 2010, including the specification, drawings, and abstract, is incorporated herein by reference in its entirety.

BACKGROUND

The present invention relates to a semiconductor device, and more particularly, to a semiconductor device including an active-barrier structure, in particular.

With a product for use in an automobile, motor-driving, an audio amplifier, and so forth, there can be a case where a counter electromotive force occurs due to an L (self inductance) load of wiring, and so forth, and a drain (an n-type region) of an output transistor will be at a negative potential. In such a case, electrons are injected into a p-type substrate from the drain by the agency of the negative potential, and the electrons move from a region where the output transistor is formed to a region where other elements are formed via the p-type substrate, thereby causing a problem that the other elements undergo malfunction.

In order to check effects of the electrons injected into the p-type substrate, on elements in peripheral region, it is conceivable to adopt, for example, the semiconductor device described in Japanese Unexamined Patent Publication No. 2009-177087 (Patent Document 1). With the semiconductor device disclosed in this Patent publication, there is provided a highly dosed region in such a way as to surround the circumference of a CMOS (Complementary Metal Oxide Semiconductor) circuit, and a ground voltage is applied to the highly dosed region.

RELATED ART DOCUMENT

Patent Document

[Patent Document 1]
Japanese Unexamined Patent Publication No. 2009-177087

SUMMARY

However, even with the semiconductor device disclosed in the Patent Document described as above, as further progress is made in the miniaturization of a semiconductor device, in particular, there is a possibility that injection of electrons from a circuit around the periphery of a circuit that need be protected will be unavoidable.

Further, as a countermeasure different from the above-mentioned, there is available another method whereby an active-barrier region is formed between the region where the output transistor is formed to the region where the other elements are formed. In the active-barrier region, a p-type region, and an n-type region, having a floating potential, are provided to undergo ohmic coupling via a conductive layer.

More specifically, electrons injected into the p-type substrate will either disappear through recombination with holes in the p-type substrate, or be taken into the n-type region of the active-barrier region. Since electrons are taken into the n-type region of the active-barrier region, the n-type region will be at a plus potential. In the active-barrier region, the p-type region, and the n-type region, having the floating potential, have undergone the ohmic coupling via the conductive layer, so that when the n-type region is at the plus potential, the p-type region of the active-barrier region will be at a minus potential in order to offset the plus potential. If the p-type region of the active-barrier region is at the minus potential, the electrons injected in the p-type substrate will have difficulty in advancing ahead of the p-type region that is at the minus potential. As a result, the electrons from the active-barrier region will have difficulty in reaching the region where the other elements are formed, so that malfunction of the other elements will be checked.

Notwithstanding the above-mentioned, there can be a case where a force to check movement of the electrons injected in the p-type substrate to reach the regions where the other element are formed will be weakened depending on a position where the active-barrier region is formed. In this case, the electrons injected in the p-type substrate can reach the regions where the other elements are formed, so that the other elements will be susceptible to undergo malfunction.

The present invention has been developed in view of the problem described as above. It is therefore an object of the invention to provide a semiconductor device that is highly effective in checking movement of electrons from a region where an output transistor is formed to a region where other elements are formed, being capable of checking malfunction of an element.

A semiconductor device according to one embodiment of the invention, the semiconductor device includes a semiconductor substrate, a first region, an output element, an element to be protected, a tap part, and a first active-barrier structure. The semiconductor substrate includes a main surface. The first region of a first conductivity type is formed inside the semiconductor substrate. The output element includes a second region of a second conductivity type, the second region being joined with the first region to form a pn junction. The element to be protected is formed on the main surface, over the first region. The tap part includes a third region of the first conductivity type, formed between the element to be protected, and the output element, and formed between the first region and the main surface such that a ground potential is applicable to the first region. The first active-barrier structure is formed on the main surface, over the first region, and disposed between the element to be protected, and the tap part. The first active-barrier structure includes a fourth region of the second conductivity type, coupled to the first region, and a fifth region of the first conductivity type, in ohmic coupling with the fourth region.

With the semiconductor device according to the one embodiment of the invention, the first active-barrier structure is formed between the element to be protected, and the tap part. Accordingly, carriers that are injected into the first region from the output element even after passing through the tap part will be blocked by the first active-barrier structure on the upstream side of the element to be protected. Hence, the carriers will have difficulty in reaching the element to be protected, so that malfunction of the element to be protected can be checked.

BRIEF DESCRIPTION OF THE DRAWINGS

FIG. 14 is a schematic plan view of a semiconductor device according to a sixth embodiment of the invention; and FIG. 15 is a schematic sectional view of a portion of the semiconductor device, taken on line XV-XV of FIG. 14.

DETAILED DESCRIPTION

Embodiments of the invention will be described hereinafter with reference to the accompanying drawings.

First Embodiment

Figure 1:
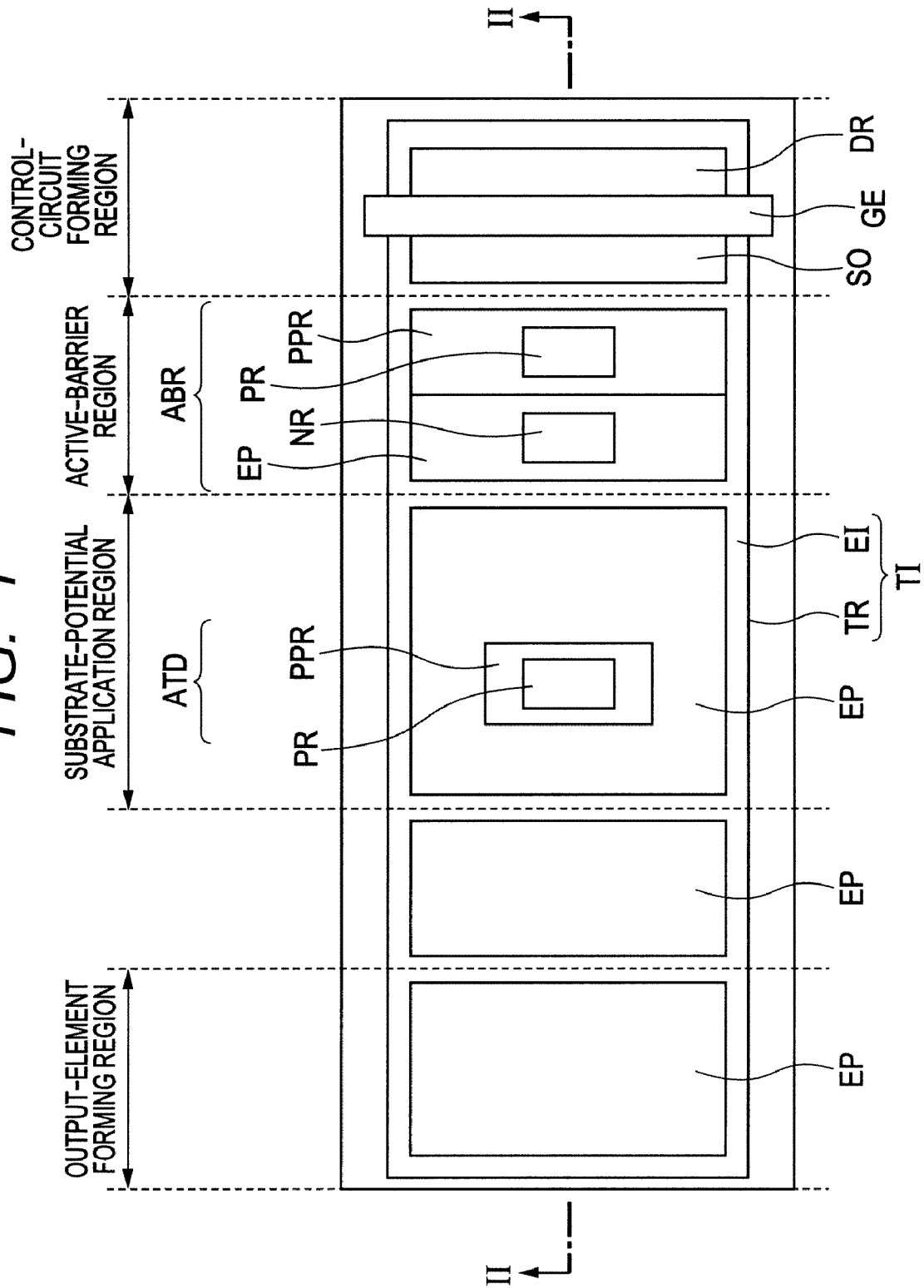
FIG. 1 is a schematic plan view of a semiconductor device according to a first embodiment of the invention.
Figure 2:
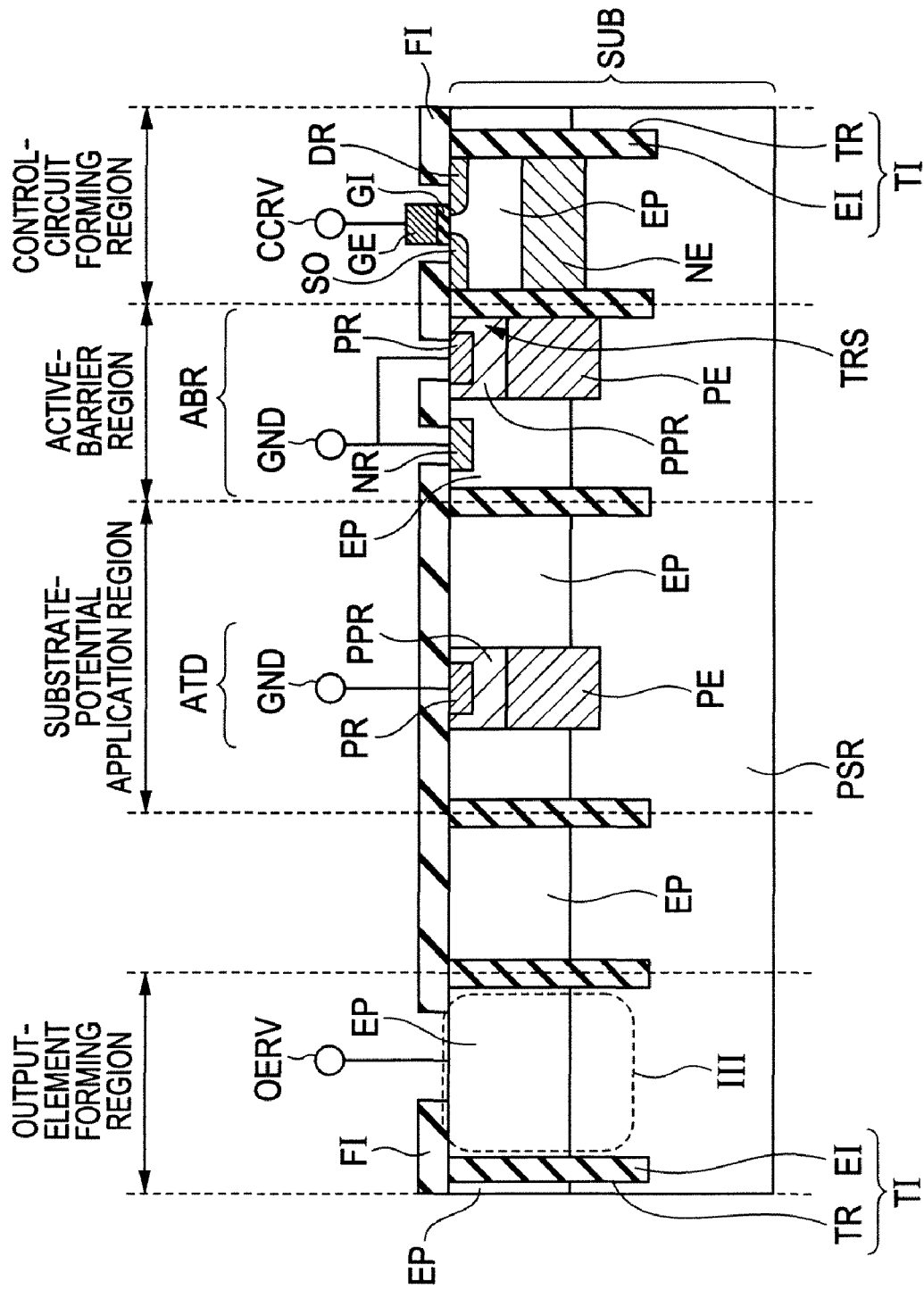
FIG. 2 is a schematic sectional view of a portion of the semiconductor device, taken on line II-II of FIG. 1.

Referring to FIGS. 1, and 2, a semiconductor device according to a first embodiment of the invention is comprised of, for example, an output-element forming region, a control-circuit forming region, a substrate-potential application region, and an active-barrier region. These regions each are provided in a semiconductor substrate SUB to be isolated from each other by virtue of an element isolation structure including a trench isolation structure TI.

Figure 3:
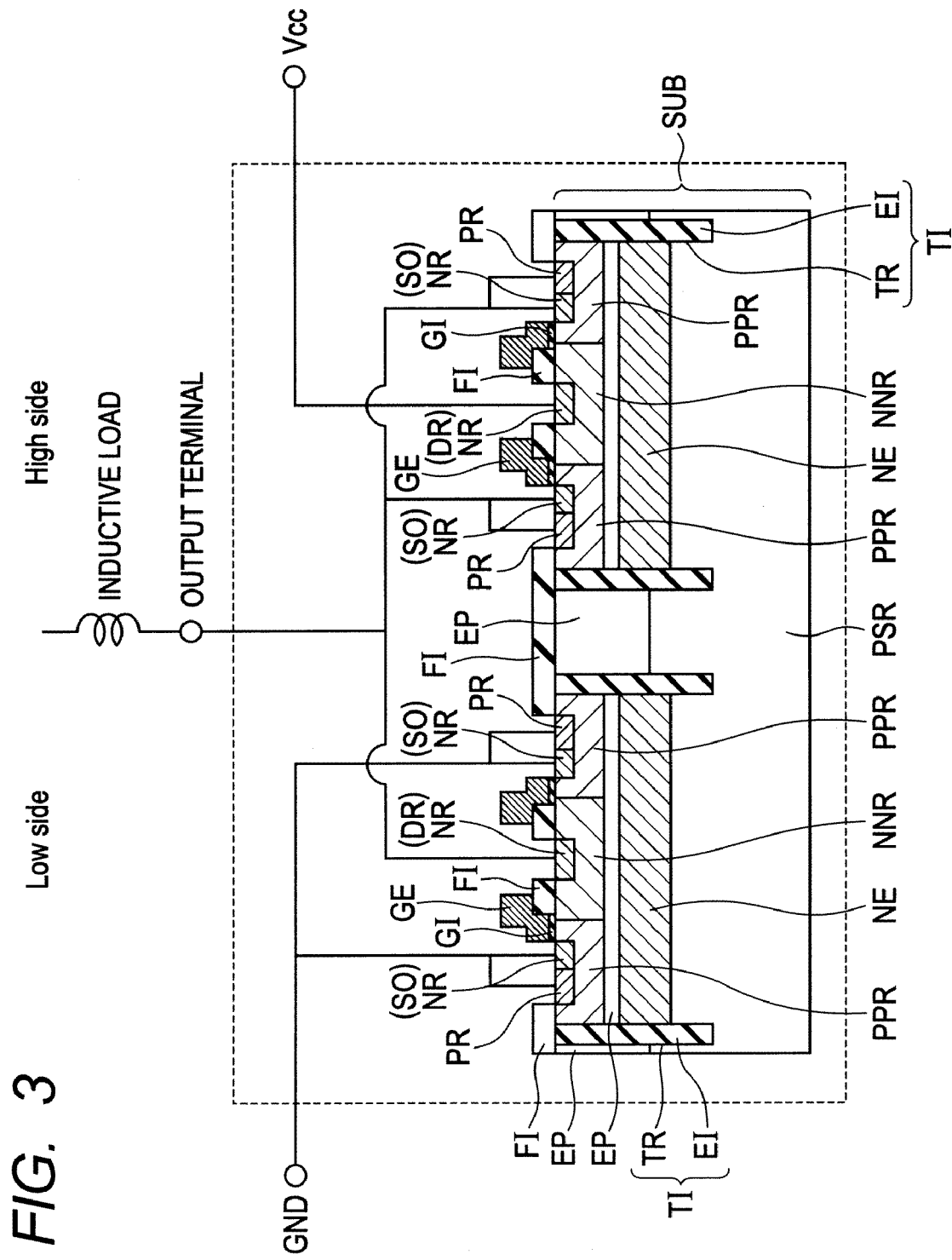
FIG. 3 is a schematic sectional view showing a configuration of an output element in a region III surrounded by a dotted line of FIG. 2, in greater detail.

Now, referring to FIGS. 2, and 3, an output element is formed in the output-element forming region. The output element includes an embedded n-type diffused region NE, an epitaxial layer EP, a high-voltage low-side MIS (Metal Insulator Semiconductor) transistor, and a high-voltage high-side MIS transistor. In FIG. 2, a specific configuration of the output element is omitted for the sake of simplification in illustration, and the specific configuration thereof is shown in FIG. 3.

Referring to FIG. 3, a p-type doped region PSR (a first region) having a p-type (a first conductivity type) is formed inside the semiconductor substrate SUB. An n-type (a second conductivity type) region (a second region) includes the embedded n-type diffused region NE, the epitaxial layer EP, an n⁻ diffused region NNR, and an n-type diffused region NR, and the n-type (the second conductivity type) region is formed in such a way as to be joined with the p-type doped region PSR to thereby form a pn junction.

A p⁻ diffused region PPR is formed over the epitaxial layer EP so as to be adjacent to the n⁻ diffused region NNR. An n-type diffused region NR, and a p-type diffused region PR are formed so as to be adjacent to each other over the main surface of the semiconductor substrate SUB, inside the p⁻ diffused region PPR.

The low-side, and high-side MIS transistors each include mainly an n-type diffused region NR (coupled to a ground terminal GND) serving as a source region SO, an n-type diffused region NR (coupled to the high side) serving as a drain region DR, a gate oxide film GI, and a gate electrode GE. The source region SO is formed inside the p⁻ diffused region PPR, and the drain region DR is formed inside the n⁻ diffused region NNR. The source region SO is formed so as to be adjacent to the p-type diffused region PR. The gate electrode GE is formed over a portion of the main surface of the semiconductor substrate SUB, sandwiched between the source region SO and the drain region DR, through the intermediary of the gate oxide film GI.

Further, an interlayer dielectric FI is formed over the main surface of the semiconductor substrate SUB, and the periphery of the MIS transistor TRS is surrounded by the trench-isolation structure TI (the element-isolation structure), inside the semiconductor substrate SUB. The trench-isolation structure TI includes a trench TR (a groove) in which an embedded insulating layer EI (a dielectric layer), such as, for example, a silicon oxide film, and so forth, is buried. A low-side MIS transistor forming-region is electrically isolated from a high-side MIS transistor forming-region by the trench-isolation structure TI.

A Vcc potential is applicable to a drain region NR of the high-side MIS transistor, and a ground potential GND is applicable to a source region NR of the low-side MIS transistor. A source region NR of the high-side MIS transistor, and a drain region NR of the low-side MIS transistor are electrically coupled to an output terminal (for example, a bonding pad of a semiconductor chip). There can be a case where the output terminal is electrically coupled to an inductive load of an external apparatus.

With the present embodiment, the output-element forming-region, the substrate-potential application region, and the active-barrier region each are surrounded by the trench-isolation structure TI inside the semiconductor substrate SUB. These regions, however, need not be surrounded by the trench-isolation structure TI.

Now, reverting to FIG. 2, control circuits, such as, for example, logic circuits, and so forth, are formed in a control-circuit forming region where, for example, a plurality of MIS transistors are incorporated. In the control-circuit forming region of FIG. 2, only one MIS transistor of the control circuit is shown for the sake of simplification in illustration. The MIS transistor TRS (an element to be protected) of the control-circuit forming region includes mainly a source region SO, a drain region DR, a gate oxide film GI, and a gate electrode GE. The source region SO, and the drain region DR are disposed over the main surface of the semiconductor substrate SUB, and are spaced from each other. The gate electrode GE is formed over a portion of the main surface of the semiconductor substrate SUB, sandwiched between the source region SO, and the drain region DR through the intermediary of the gate oxide film GI. The MIS transistor TRS is formed inside an n-type epitaxial layer EP that is formed over an embedded n-type diffused region NE disposed over the p-type doped region PSR. A control voltage CCRV is applied to the gate electrode GE.

In the substrate-potential application region, there is formed a region (a tap part ATD) including a p-type region (a third region) ranging from the main surface of the semiconductor substrate SUB to the p-type doped region PSR. This p-type region includes an embedded p-type diffused region PE, a p⁻ diffused region PPR, and a p-type diffused region PR. A ground terminal GND is coupled to the p-type diffused region PR, thereby rendering it possible to apply the ground potential GND to the p-type doped region PSR of the semiconductor substrate SUB.

In the active-barrier region, there is formed an active-barrier ABR (a first active-barrier structure) including an n-type region (a fourth region), and a p-type region (a fifth region), the n-type region, and the p-type region being disposed so as to be adjacent to each other. There is provided ohmic coupling between the n-type region, and the p-type region. The n-type region includes an n-type epitaxial layer EP, and an n-type diffused region NR, while the p-type region includes an embedded p-type diffused region PE, a p⁻diffused region PPR, and a p-type diffused region PR. Further, ohmic coupling is provided between the n-type diffused region NR, and the p-type diffused region PR, both of which are coupled to a ground terminal GND.

With the semiconductor device according to the present embodiment, the output-element forming region, the substrate-potential application region, the active-barrier region, and the control-circuit forming region are arranged in this order along the main surface of the semiconductor substrate SUB. More specifically, the substrate-potential application region is formed between the output-element forming region, and the control-circuit forming region. Further, the active-barrier region is formed between the substrate-potential application region, and the control-circuit forming region.

Now, an operation effect of the semiconductor device according to the present embodiment is described hereinafter in comparison with a semiconductor device according to a comparative example. Referring to FIG. 3, when the high-side MIS transistor is in the ON state, while the low-side MIS transistor is in the OFF state, current flows from the high-side MIS transistor into the inductive load. When an operation is changed over from this state to a state in which the high-side MIS transistor is tuned OFF while the low-side MIS transistor is turned ON, the inductive load tends to cause the current to continue flowing. As a result, an electromotive force is generated, so that a negative potential is applied to the drain region NR of the low-side MIS transistor. For this reason, forward bias is applied to a pn junction between the p-type doped region PSR, and each of those n-type regions NR, NNR, EP, and NE, provided in a region where the low-side MIS transistor is formed, whereupon electrons are injected into the p-type region from the respective n-type regions NR, NNR, EP, and NE.

Figure 4:
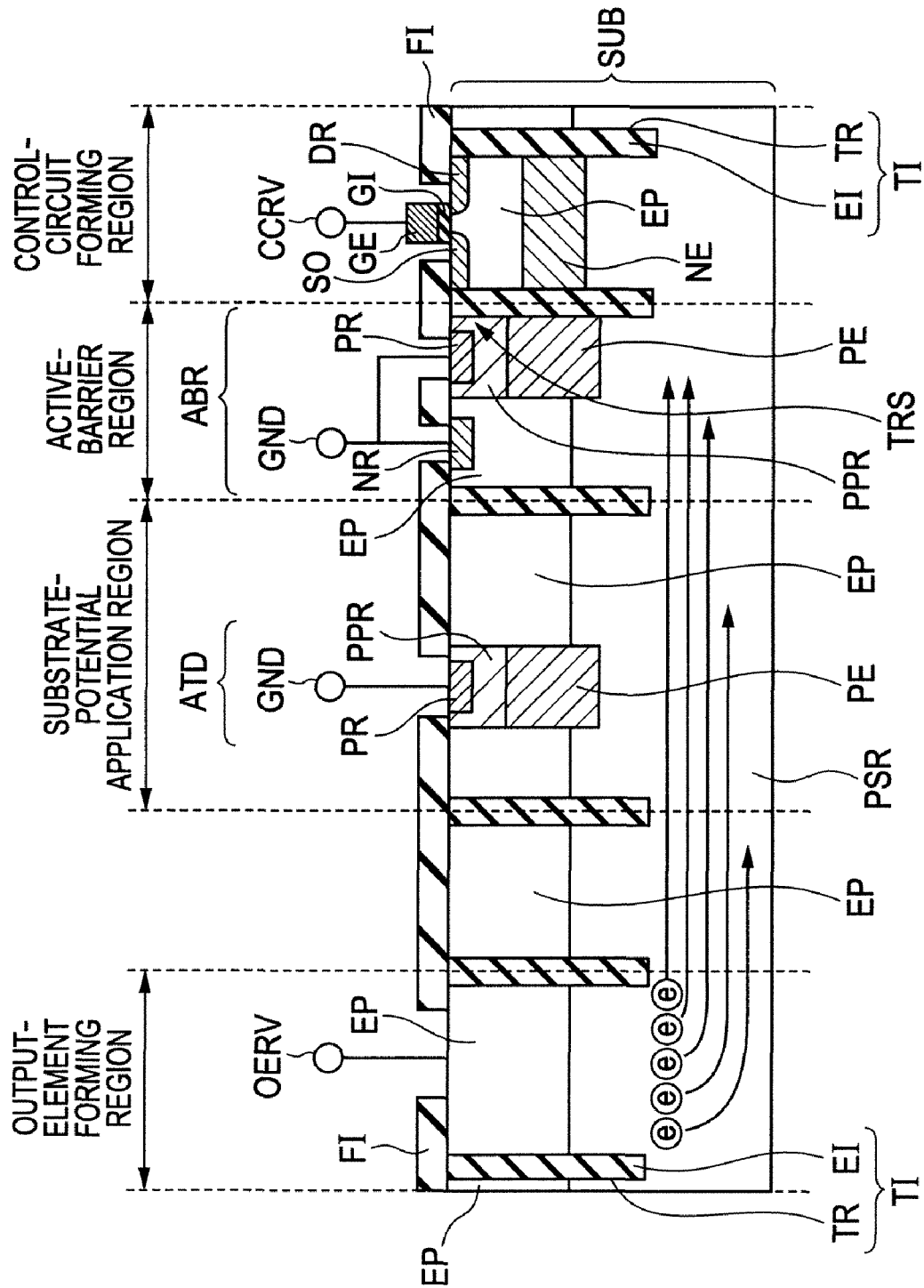
FIG. 4 is a schematic sectional view showing the behavior of electrons inside the semiconductor device according to the first embodiment of the invention.

Referring to FIG. 4, since the concentration of a p-type dopant in the p-type doped region PSR is low, electrons entering the p-type doped region PSR are insusceptible to undergo recombination with holes inside the p-type doped region PSR. In consequence, most of electrons diffused in the p-type doped region PSR are drawn toward the substrate-potential application region by the agency of a ground voltage applied to the tap part ATD of the substrate-potential application region. The reason for this is because a voltage OERV applied to the n-type region of the output-element forming region is at a negative potential, and therefore, the ground voltage of the tap part ATD is turned higher than the negative potential. Because electrons tend to move toward a higher potential side, the electrons that have entered the p-type doped region PSR of the output-element forming region will move toward the substrate-potential application region to which the ground voltage has been applied.

A portion of the electrons that have reached the substrate-potential application region will have extra momentum to pass through the substrate-potential application region, further moving toward the active-barrier region. The electrons that have moved to the first active-barrier region are taken into the n-type diffused region NR of the active-barrier region.

Herein, in the active-barrier region, the n-type region is in ohmic coupling with the p-type region, so that a portion of the electrons captured by the n-type region will undergo recombination with holes fed from the p-type region as shorted-circuited via wiring, whereupon the potential of the p-type region having fed the holes drops. When the potential of the p-type region of the active-barrier region turns lower, the electrons injected in the p-type doped region PSR will be liable to have difficulty in advancing toward the control-circuit forming region (on the downstream side of the p-type region whose potential has turned lower). As a result, the electrons from the active-barrier region are liable to have difficulty in reaching the control-circuit forming region. Accordingly, it is possible to keep the electrons from entering any of the MIS transistors TRS, such as logic circuits, and so forth, formed in the control-circuit forming region, thereby suppressing occurrence of a trouble due to malfunction of the MIS transistor TRS.

In this connection, the n-type region of the active-barrier ABR is disposed closer to the output-element forming region than the p-type region. By so doing, it is possible to enhance an advantageous effect of the n-type region checking the ingress of electrons into the p-type region.

Figure 5:
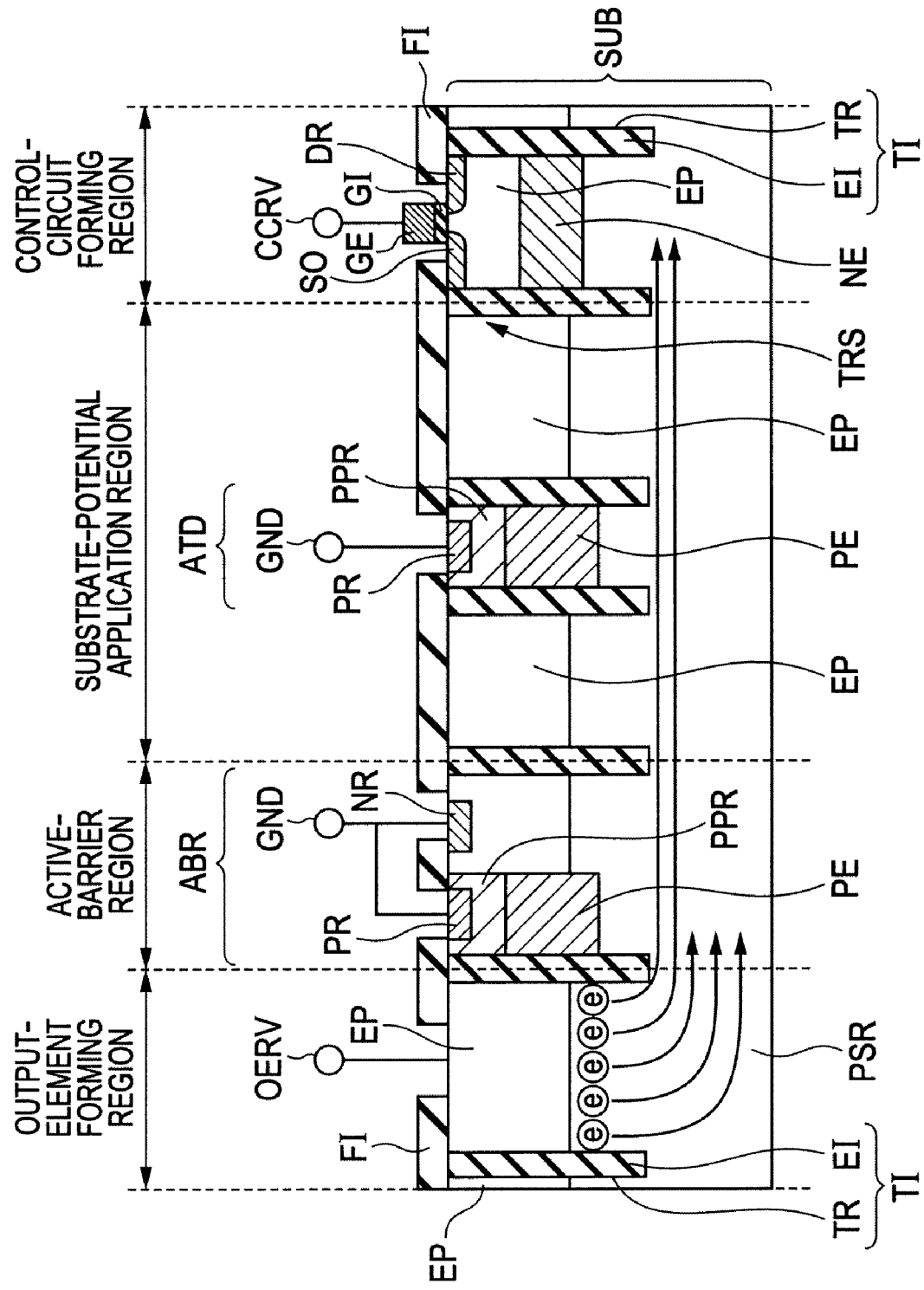
FIG. 5 is a schematic plan view showing the behavior of electrons inside a semiconductor device according to a comparative example.

Now, referring to FIG. 5, the semiconductor device according to the comparative example differs from the semiconductor device according to the present embodiment, shown in FIG. 2, in that with the semiconductor device according to the comparative example, an active-barrier region is disposed between an output-element forming region, and a substrate-potential application region instead of between the substrate-potential application region, and a control-circuit forming region. In comparison of FIG. 4 with FIG. 5, electrons from an n-type region of the output-element forming region of the semiconductor device shown in FIG. 5, entering a p-type doped region PSR thereof, are drawn toward the substrate-potential application region by the agency of the ground voltage applied to a tap part ATD of the substrate-potential application region.

Herein, since the active-barrier region is disposed upstream from the substrate-potential application region, a portion of the electrons is taken into an n-type region of the active-barrier region, thereby causing the potential of a p-type region of the active-barrier region to drop. For this reason, movement of electrons toward the downstream side of the p-type region of the active-barrier region is checked.

Nevertheless, since the tap part ATD is disposed on the downstream side of the active-barrier region, a portion of the electrons is strongly attracted by the tap part ATD rather than by the n-type region of the active-barrier region. Accordingly, the portion of the electrons passes through the active-barrier region to thereby reach the substrate-potential application region. On the downstream side of the substrate-potential application region, there does not exist a region for checking movement of electrons, such as the active-barrier region. Hence, the electrons will enter the control-circuit forming region, so that there is a greater possibility that a trouble will occur due to malfunction of a MIS transistor TRS.

Assuming that the number of electrons that come from the output-element of the semiconductor device of FIG. 4, and enter the p-type doped region PSR, and so forth are equal to those, for the semiconductor device of FIG. 5, the number of the electrons reaching the active-barrier region of the semiconductor device according to the present embodiment of FIG. 4 will be fewer than that for the semiconductor device according to the comparative example of FIG. 5. The reason for this is because with the semiconductor device shown in FIG. 4, the active-barrier region is disposed on a side of the substrate-potential application region, adjacent to the control-circuit forming region, and closer to the control-circuit forming region as compared with the case of the comparative example shown in FIG. 5.

With the semiconductor device according to the present embodiment, the active-barrier region is disposed on the downstream side of the substrate-potential application region, so that a higher proportion of the electrons having reached the active-barrier region is captured by the n-type region of the active-barrier region. Accordingly, it is possible to further reduce an amount of the electrons passing through the active-barrier region to reach the control-circuit forming region.

Further, with the semiconductor device according to the present embodiment, shown in FIG. 4, a distance from the output-element forming region to the active-barrier region is longer as compared with the semiconductor device according to the comparative example shown in FIG. 5. Accordingly, there will be an increase in the number of electrons that will disappear in the first place by undergoing recombination with the p-type dopant before reaching the active-barrier region. In consequence, the number of electrons that will reach the active-barrier region is less as compared with the semiconductor device of FIG. 5. It follows therefore that the number of electrons passing through the active-barrier region to reach the control-circuit forming region can be further reduced.

As described in the foregoing, with the semiconductor device according to the present embodiment, a positional relationship between the substrate-potential application region, and the active-barrier region is specified, so that it is possible to check the ingress of electrons only into a circuit region where the ingress of electrons is truly needed. For this reason, it is unnecessary to specify a positional relationship between the output-element, and the logic circuit. Accordingly, it is possible to enhance layout flexibility with regard to the output-element forming region, and the control-circuit forming region.

Still further, with the semiconductor device according to the present embodiment, the trench-isolation structure TI is formed between the active-barrier region and the control-circuit forming region. In other words, the active-barrier ABR is electrically isolated from the MIS transistor TRS. For this reason, it is possible to further reduce the amount of the electrons passing through the active-barrier region to reach the control-circuit forming region.

Furthermore, since the trench-isolation structure TI including the embedded insulating layer EI is provided, it is possible to further enhance an advantageous effect of checking movement of the electrons from the active-barrier region to the control-circuit forming region.

Second Embodiment

A second embodiment of the invention differs from the first embodiment in respect of a layout for respective regions making up a semiconductor device according to the second embodiment as compared with the first embodiment. A configuration of the semiconductor device according to the present embodiment is described hereinafter.

Figure 6:
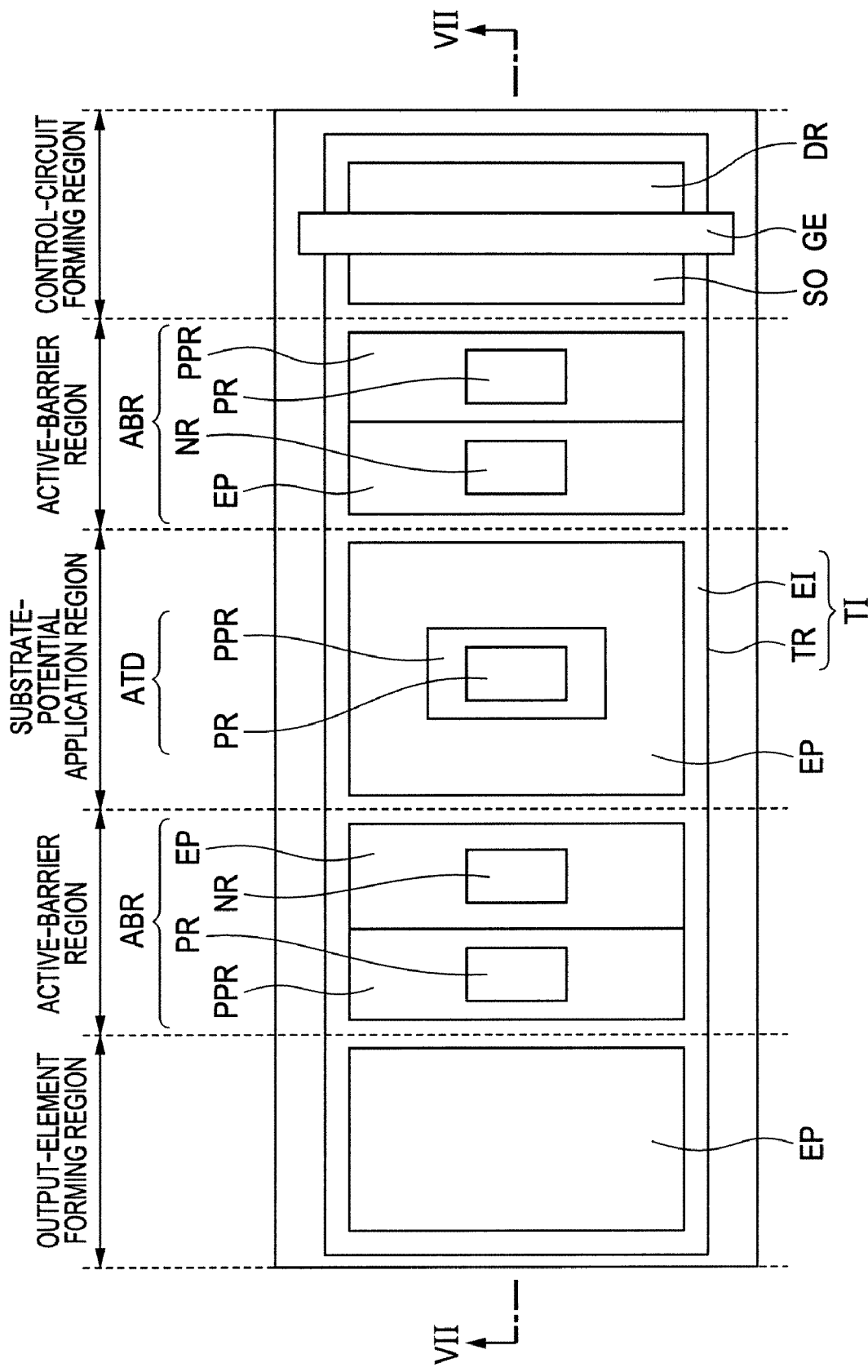
FIG. 6 is a schematic plan view of a semiconductor device according to a second embodiment of the invention.
Figure 7:
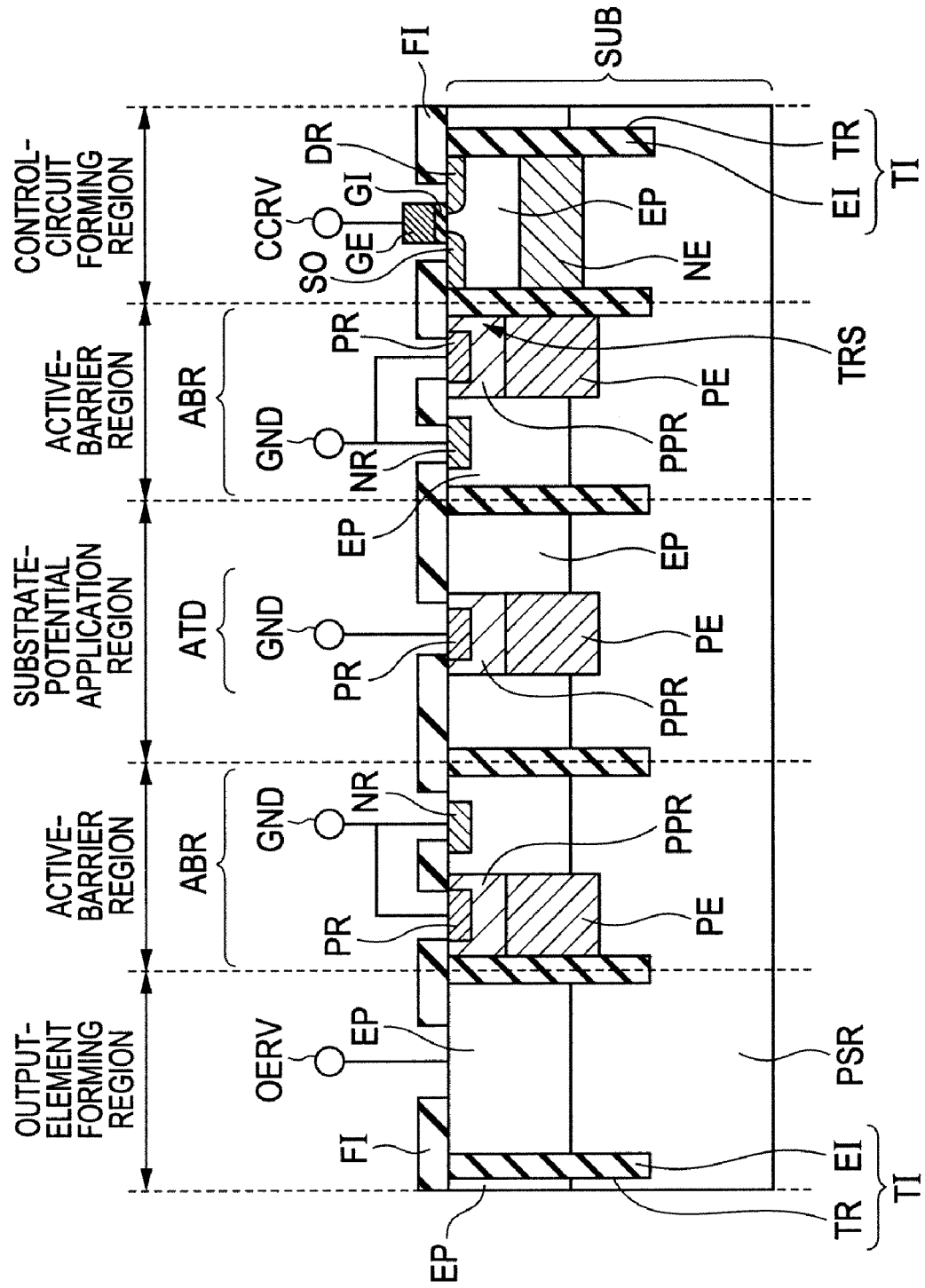
FIG. 7 is a schematic sectional view of a portion of the semiconductor device, taken on line VII-VII of FIG. 6.

Referring to FIGS. 6, and 7, the semiconductor device according to the present embodiment is further provided with an active-barrier region located between an output-element forming region, and a substrate-potential application region. This active-barrier region includes an active-barrier ABR (a second active-barrier structure).

The second active-barrier ABR includes an n-type region (a sixth region) and a p-type region (a seventh region), and is basically similar in configuration to the first active-barrier structure ABR. With the second active-barrier ABR, however, the p-type region is preferably disposed on a side of the second active-barrier ABR, closer to the output-element forming region than the n-type region.

Further, since the semiconductor device according to the present embodiment, except for the above, is substantially equal in configuration to the semiconductor device according to the first embodiment, elements in FIGS. 6, and 7, identical to those in the semiconductor device according to the first embodiment, are denoted by like reference numerals, thereby omitting repetition in description thereof.

Now, an operation effect of the semiconductor device according to the present embodiment is described hereinafter. If the active-barrier region is disposed at two locations as in the case of the present embodiment, this will enable an advantageous effect of checking the ingress of electrons into a control-circuit forming region to be further enhanced as compared with the case where the active-barrier region is disposed only at one location as in the case of the first embodiment. This is explained about hereinafter.

First, electrons that are injected into a p-type doped region PSR from the output-element forming region are drawn toward the substrate-potential application region as is the case with the first embodiment. A portion of the electrons is taken into the n-type region of the second active-barrier ABR, whereupon the potential of the p-type region of the second active-barrier ABR drops. This will check movement of the electrons toward downstream from the p-type region of the second active-barrier ABR.

Nevertheless, the electrons that have passed through the second active-barrier ABR to reach the substrate-potential application region will exhibit the same behavior as that of the electrons in the case of the first embodiment. This is because the semiconductor device according to the second embodiment is the same in configuration as the semiconductor device according to the first embodiment as far as the downstream side of the substrate-potential application region is concerned.

With the semiconductor device according to the present embodiment, a ratio of the number of the electrons reaching the substrate-potential application region to the number of the electrons entering the p-type doped region PSR from the output-element forming region will be lower as compared with the case of the semiconductor device according to the first embodiment. For this reason, a proportion of the electrons reaching the first active-barrier ABR will be lower as compared with the case of the semiconductor device according to the first embodiment. Hence, a proportion of the electrons reaching the control-circuit forming region will be lower as compared with the case of the semiconductor device according to the first embodiment.

The semiconductor device according to the second embodiment differs only in respective points described as above from the semiconductor device according to the first embodiment. That is, the semiconductor device according to the second embodiment is in full conformity with the semiconductor device according to the first embodiment in respect of configuration, condition, procedure, effects, and so forth, which are omitted in the description given as above.

Third Embodiment

A third embodiment of the invention differs from the first embodiment in respect of a configuration of a first active-barrier structure as compared with the first embodiment. A configuration of a semiconductor device according to the present embodiment is described hereinafter.

Figure 8:
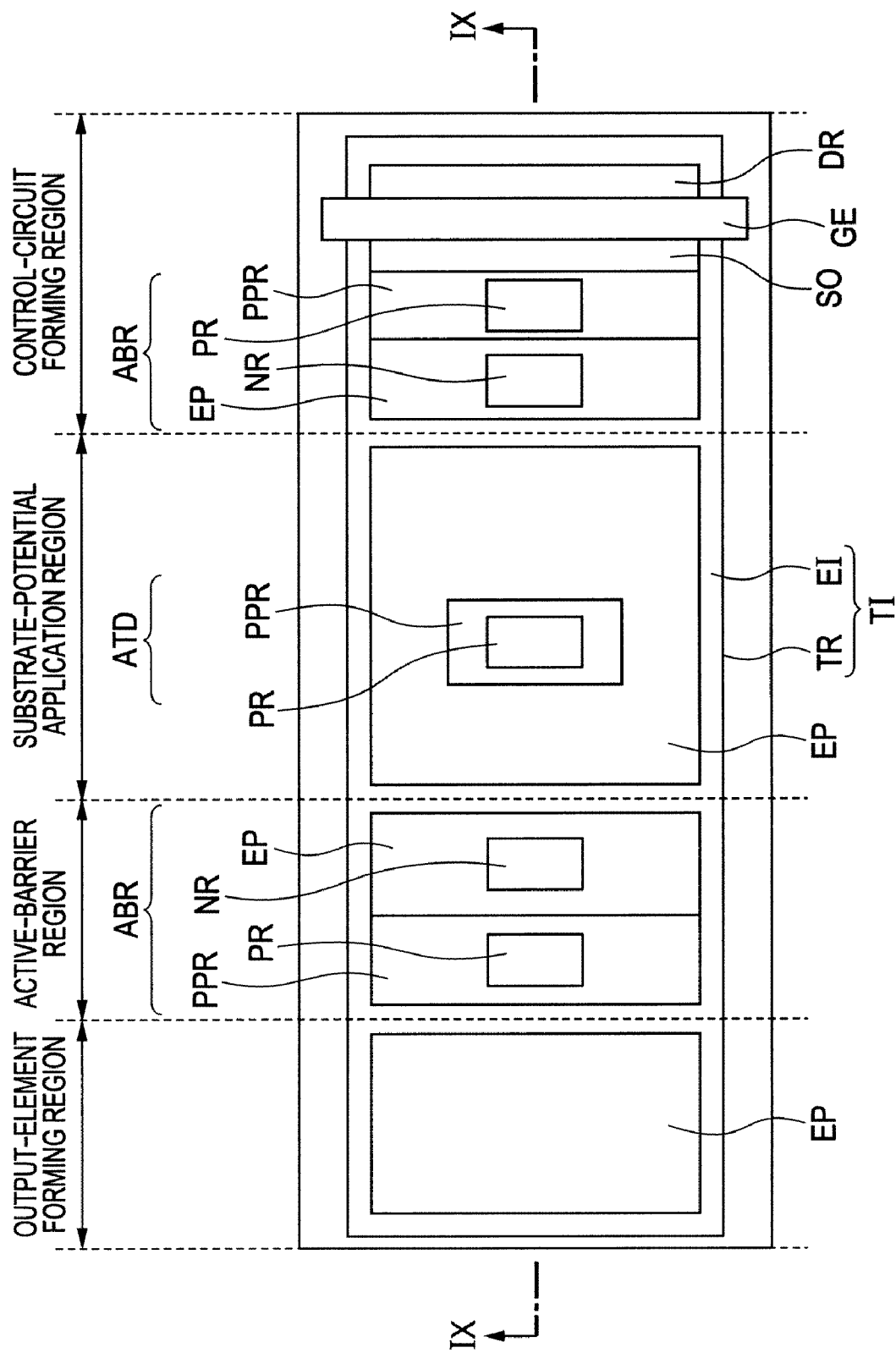
FIG. 8 is a schematic plan view of a semiconductor device according to a third embodiment of the invention.
Figure 9:
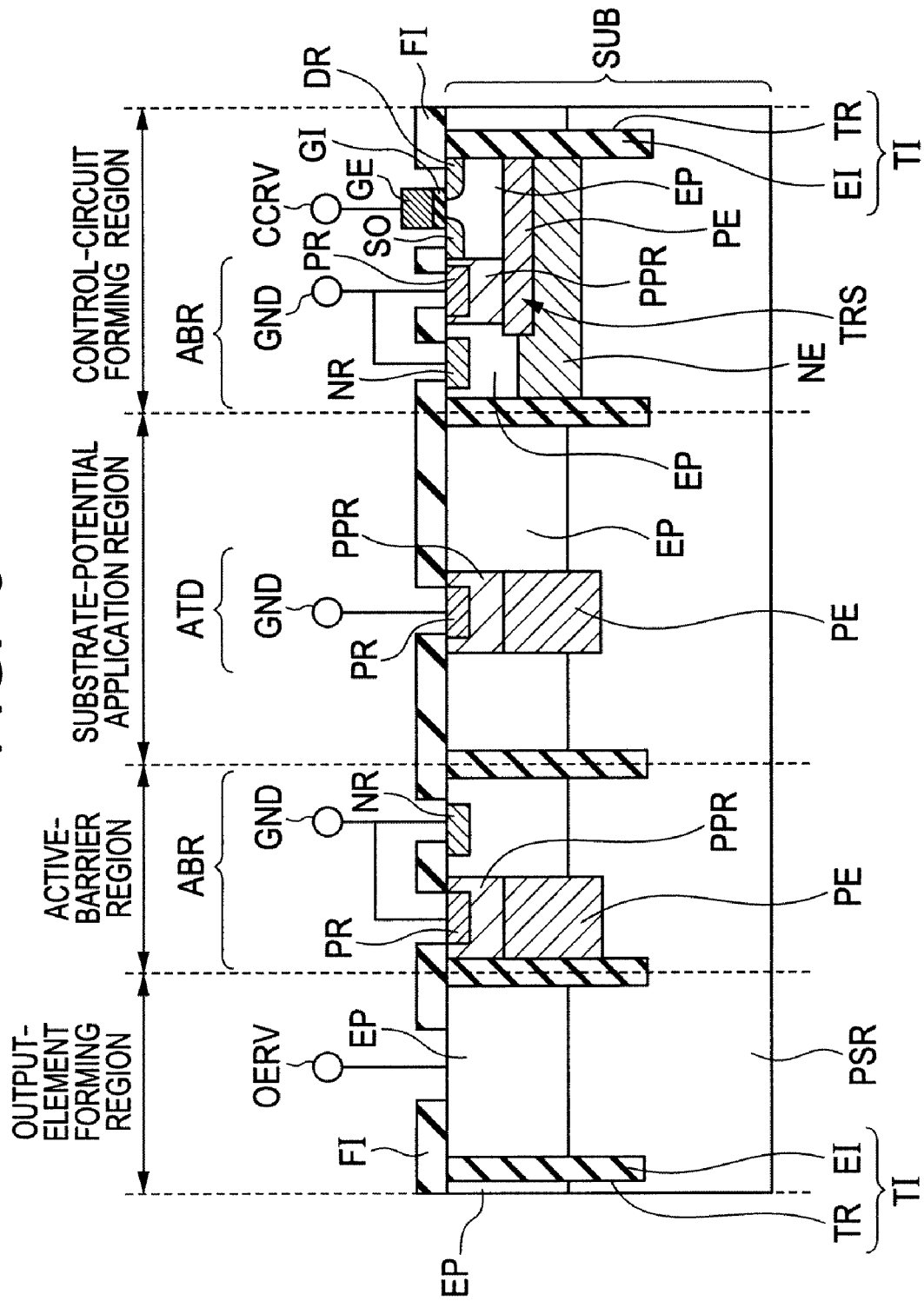
FIG. 9 is a schematic sectional view of a portion of the semiconductor device, taken on line IX-IX of FIG. 8.

Referring to FIGS. 8, and 9, with the semiconductor device according to the present embodiment, a control-circuit forming region includes a MIS transistor TRS, and an active-barrier ABR (the first active-barrier structure). The MIS transistor TRS, and the active-barrier ABR are disposed in such a way as to be adjacent to each other, and to be in contact with each other.

The first active-barrier ABR includes an n-type region (the fourth region), and a p-type region (the fifth region), the n-type region, and the p-type region being disposed so as to be adjacent to each other. There is provided ohmic coupling between the n-type region, and the p-type region. The n-type region includes an embedded n-type diffused region NE, an n-type epitaxial layer EP, and an n-type diffused region NR. The embedded n-type diffused region NE is formed so as to be in contact with a p-type doped region PSR of a semiconductor substrate SUB. Further, the p-type region includes an embedded p-type diffused region PE, a p⁻ diffused region PPR, and a p-type diffused region PR. The n-type diffused region NR, and the p-type diffused region PR are coupled to a ground terminal GND.

In the control-circuit forming region, the embedded p-type diffused region PE is disposed underneath the p⁻ diffused region PPR, and the MIS transistor TRS. A portion of the embedded p-type diffused region PE may be wedged into the epitaxial layer EP of the n-type region. The embedded n-type diffused region NE is disposed underneath the embedded p-type diffused region PE, and the epitaxial layer EP.

A trench-isolation structure TI is disposed so as to surround both the MIS transistor TRS, and the active-barrier ABR. More specifically, a side part of the MIS transistor TRS is surrounded by the trench-isolation structure TI, and the bottom of the MIS transistor TRS is covered by the embedded p-type diffused region PE, and embedded n-type diffused region NE. Further, to be more specific, with the semiconductor device according to the present embodiment, the bottom as well as the side part (the left side in FIG. 9) of the MIS transistor TRS of the control-circuit forming region is surrounded by the p-type region of the active-barrier ABR, and the bottom as well as a side part (the left side in FIG. 9) of the p-type region is surrounded by the n-type region of the active-barrier ABR.

Further, the semiconductor device according to the present embodiment, as well, is provided with an active-barrier region (the second active-barrier structure ABR) that is disposed between an output-element forming region, and a substrate-potential application region, as is the case with the semiconductor device according to the first embodiment.

Further, since the semiconductor device according to the present embodiment, except for the above, is substantially equal in configuration to the semiconductor device according to the first embodiment, elements in FIGS. 8, and 9, identical to those in the semiconductor device according to the first embodiment, are denoted by like reference numerals, thereby omitting repetition in description thereof.

Now, an operation effect of the semiconductor device according to the present embodiment is described hereinafter. With the semiconductor device according to the present embodiment, as well, a portion of electrons injected into the p-type doped region PSR from the output-element forming region will have extra momentum to pass through the substrate-potential application region to move toward the first active-barrier region. At this point in time, the portion of the electrons is taken in the embedded n-type diffused region NE of the first active-barrier. Then, since ohmic coupling is provided between the n-type region, and the p-type region, a portion of holes of the p-type region will undergo recombination, thereby causing the potential of the p-type region to drop. Hence, flow of electrons into the p-type region is checked.

Now, the bottom as well as the side part (the left side in FIG. 9) of the MIS transistor TRS of the control-circuit forming region is surrounded by the p-type region of the active-barrier ABR, and a side part (the right side in FIG. 9) thereof is surrounded by the trench-isolation structure TI. The p-type region of the active-barrier ABR, and the trench-isolation structure TI each function as a barrier for blocking the ingress of electrons. Hence, the ingress of electrons into the MIS transistor TRS is checked with greater certainty.

With the present embodiment, as well, the second active-barrier structure is provided on the upstream side of the substrate-potential application region. For this reason, the number of electron reaching the control-circuit forming region can be further reduced in the first place. It follows therefore that the ingress of electrons into the MIS transistor TRS can be checked with greater certainty.

The semiconductor device according to the third embodiment differs only in respective points described as above from the semiconductor device according to the first embodiment. That is, the semiconductor device according to the third embodiment is in full conformity with the semiconductor device according to the first embodiment in respect of configuration, condition, procedure, effects, and so forth, which are omitted in the description given as above.

Fourth Embodiment

A fourth embodiment of the invention differs from the first embodiment in respect of the configuration of an element-isolation structure as compared with the first embodiment. A configuration of a semiconductor device according to the present embodiment is described hereinafter.

Figure 10:
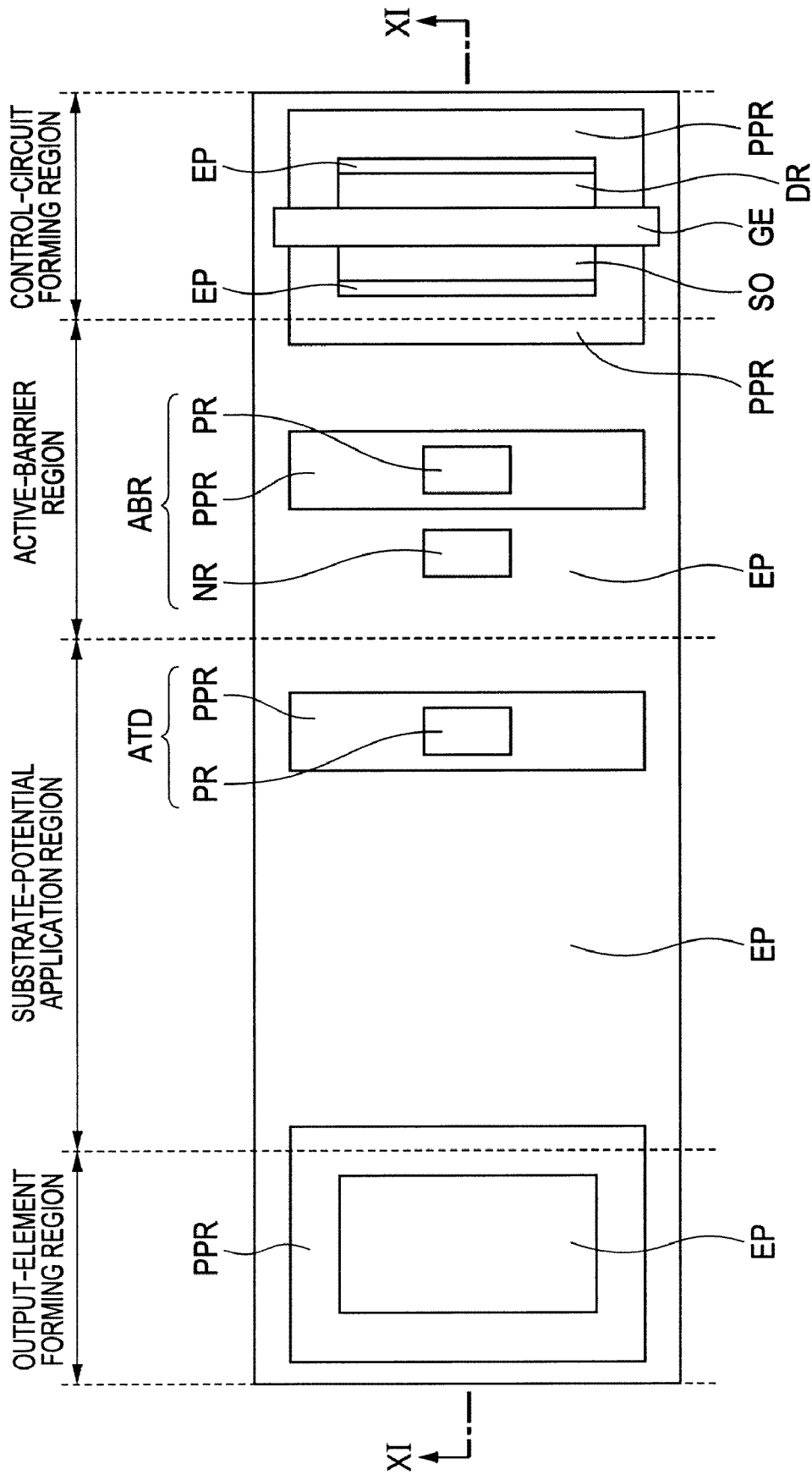
FIG. 10 is a schematic plan view of a semiconductor device according to a fourth embodiment of the invention.
Figure 11:
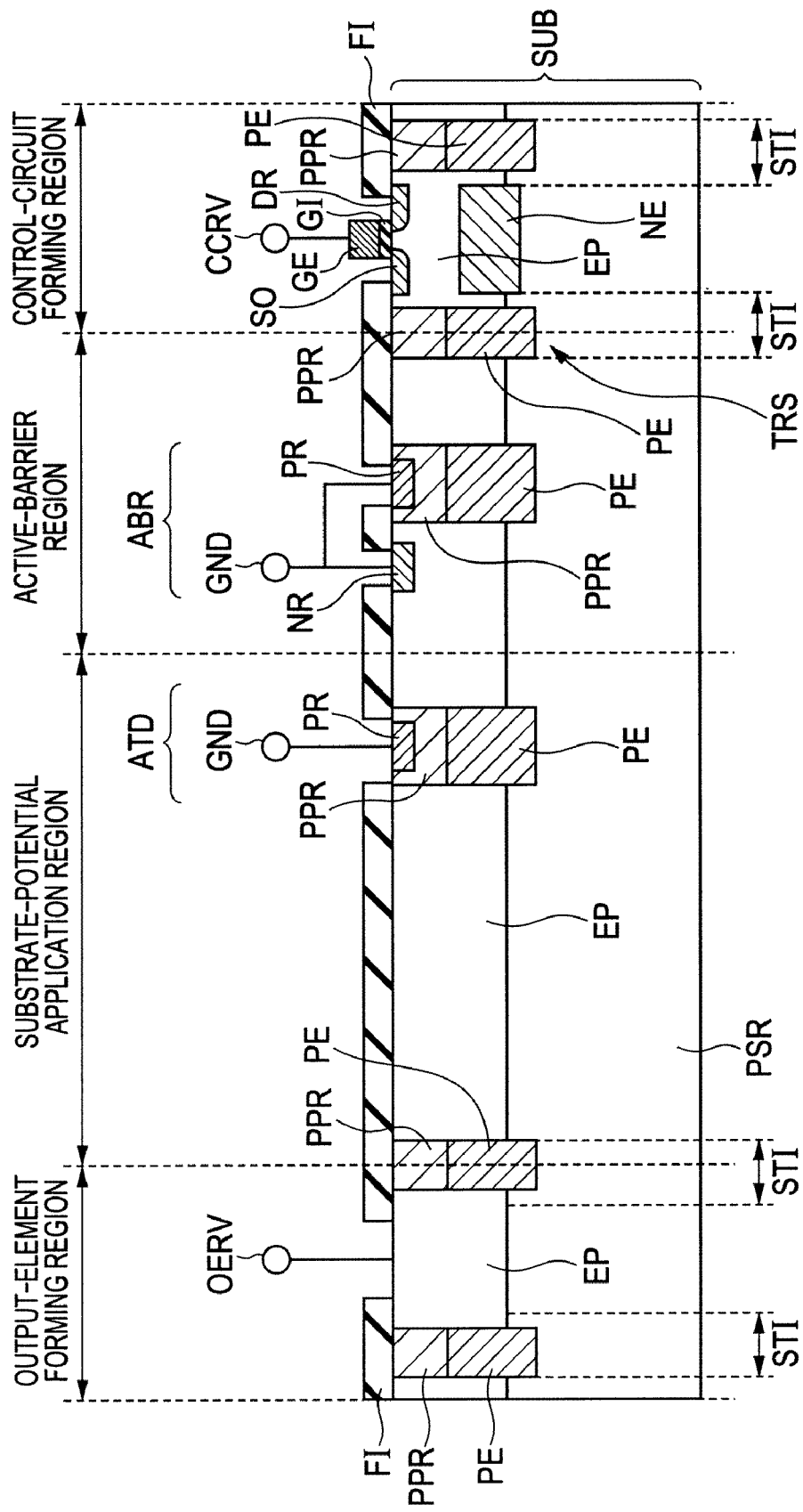
FIG. 11 is a schematic sectional view of a portion of the semiconductor device, taken on line XI-XI of FIG. 10.

Referring to FIGS. 10, and 11, with the semiconductor device according to the present embodiment, elements formed in an output-element forming region, and elements formed in a control-circuit forming region are surrounded by each region (each pn-junction region STI) where a p-type region and an n-type region are joined together.

More specifically, for example, a MIS transistor TRS is surrounded by an epitaxial layer EP that is the n-type region, and the p-type region. The n-type region is a region where the epitaxial layer EP serving as the substrate of the MIS transistor TRS is extended around the outer periphery of the MIS transistor TRS. The outer side of the epitaxial layer EP is surrounded by the p-type region. The p-type region is formed so as to range from the main surface of the semiconductor substrate SUB to a p-type doped region PSR, the p-type region including a p⁻ diffused region PPR, and an embedded p-type diffused region PE.

With the semiconductor device according to the present embodiment, neither the periphery of a substrate-potential application region, nor the periphery of an active-barrier region (the first active-barrier) is surrounded by the pn-junction region. However, these regions each may be surrounded by the pn-junction region STI. For example, in order to electrically isolate a tap part ATD that is not surrounded by the pn-junction region STI from an active-barrier ABR that is not surrounded by the pn-junction region STI, dimensions along the main surface are preferably rendered larger than those for the semiconductor device according to the first embodiment.

As shown in the case of the present embodiment, the element-isolation structure may include the pn-junction region in place of the trench-isolation structure TI including a dielectric layer. A depletion layer occurs between the p-type region and the n-type region, inside the pn-junction region. The pn-junction region, therefore, functions as the dielectric layer.

The semiconductor device according to the fourth embodiment differs only in aspect of respective points described as above from the semiconductor device according to the first embodiment. That is, the semiconductor device according to the fourth embodiment is in full conformity with the semiconductor device according to the first embodiment in respect of configuration, condition, procedure, effects, and so forth, which are omitted in the description given as above.

Fifth Embodiment

A fifth embodiment of the invention differs from the second embodiment in respect of the configuration of an element-isolation structure as compared with the second embodiment. A configuration of a semiconductor device according to the present embodiment is described hereinafter.

Figure 12:
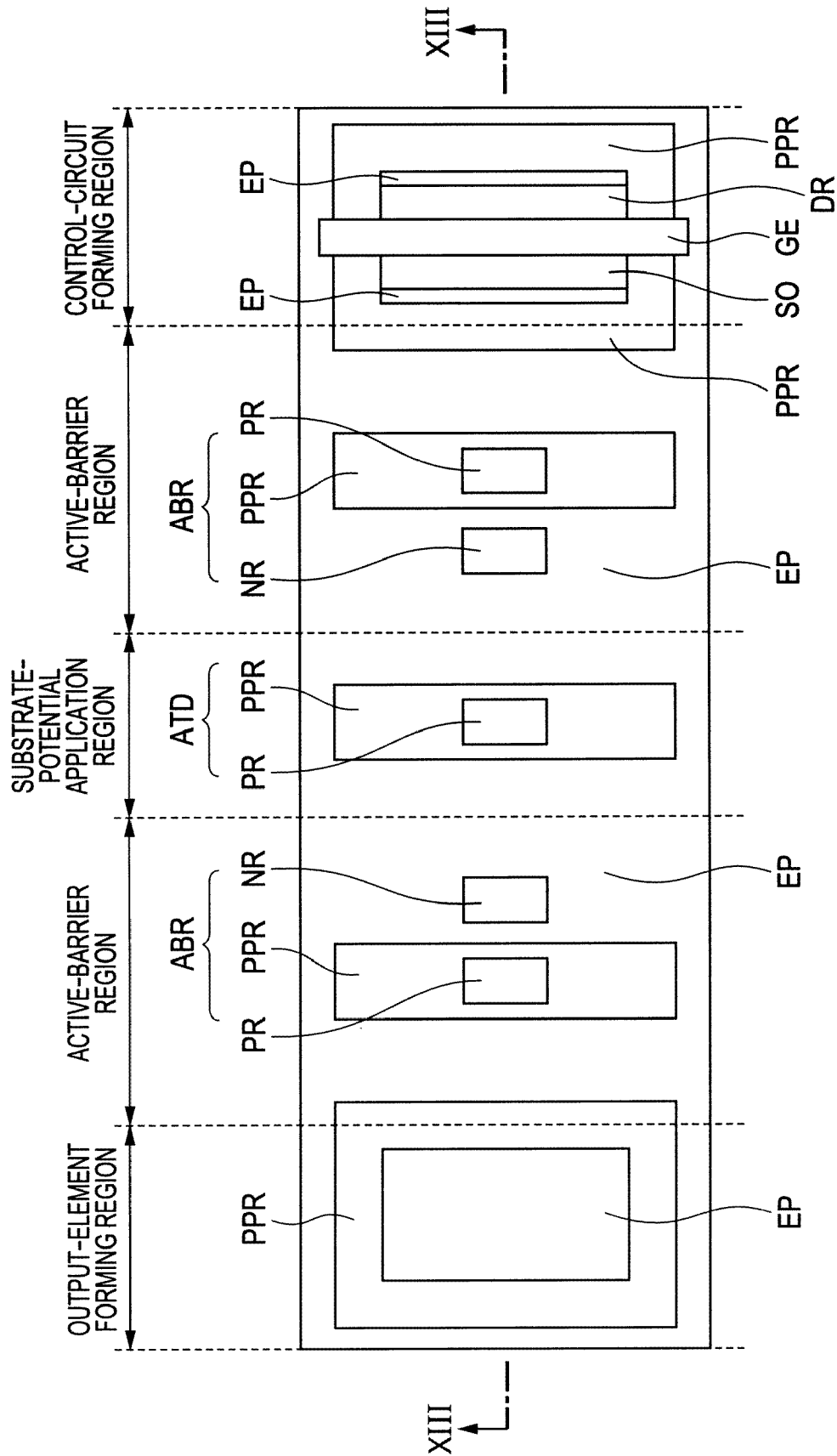
FIG. 12 is a schematic plan view of a semiconductor device according to a fifth embodiment of the invention.
Figure 13:
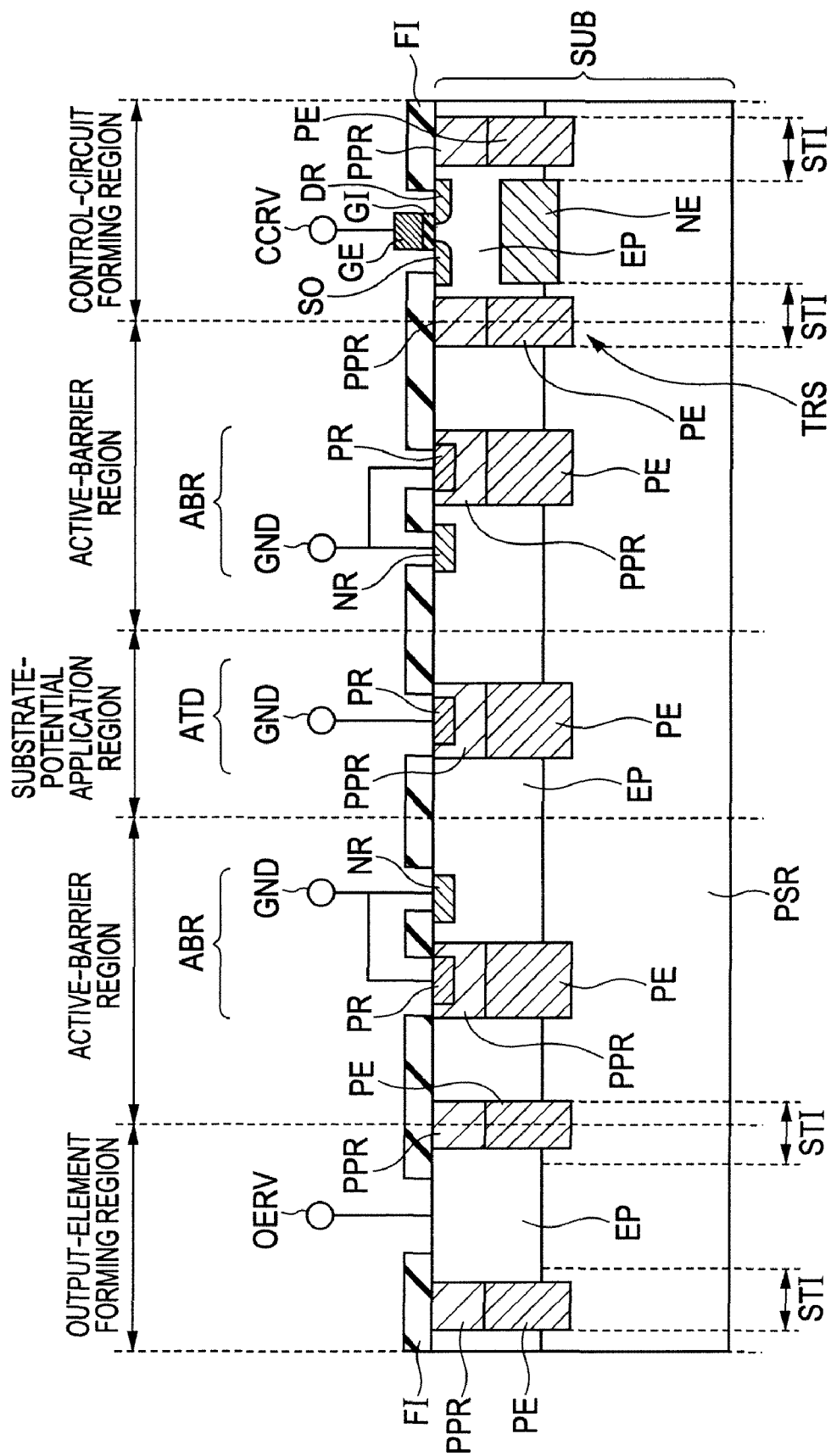
FIG. 13 is a schematic sectional view of a portion of the semiconductor device, taken on line XIII-XIII of FIG. 12.

Referring to FIGS. 12, and 13, with the semiconductor device according to the present embodiment, for an element-isolation structure, use is made of the same pn-junction region STI as is shown in FIGS. 10, and 11, in place of the trench-isolation structure TI of the semiconductor device according to the second embodiment. With the semiconductor device according to the present embodiment, as well, the pn-junction region STI is not formed in parts of the regions of the semiconductor device, such as the periphery of, for example, a substrate-potential application region, and so forth, as is the case with the fourth embodiment. With the semiconductor device according to the present embodiment, as well, since the pn-junction region functions as the dielectric layer, the present embodiment exhibits the same advantageous effect as shown in the case of the second embodiment.

The semiconductor device according to the fifth embodiment differs only in respective points described as above from the semiconductor device according to the second embodiment. That is, the semiconductor device according to the fifth embodiment is in full conformity with the semiconductor device according to the second embodiment in respect of configuration, condition, procedure, effects, and so forth, which are omitted in the description given as above.

Sixth Embodiment

A six embodiment of the invention differs from the third embodiment in respect of the configuration of an element-isolation structure as compared with the third embodiment. A configuration of a semiconductor device according to the present embodiment is described hereinafter.

Referring to FIGS. 14, and 15, with the semiconductor device according to the present embodiment, for an element-isolation structure, use is made of the same pn-junction region STI as is shown in FIGS. 10, and 11, in place of the trench-isolation structure TI of the semiconductor device according to the third embodiment. Further, with the semiconductor device according to the present embodiment, as well, the pn-junction region STI is not formed in parts of the regions of the semiconductor device, such as the periphery of, for example, a substrate-potential application region, and so forth, as is the case with the fourth embodiment, and the fifth embodiment.

In FIGS. 14, and 15, a MIS transistor TRS is disposed so as to be adjacent to a first active-barrier ABR as the case with the semiconductor device according to the third embodiment. In this case, the bottom as well as a side part of the MIS transistor TRS is surrounded by a p-type region (the fourth region) of the first active-barrier ABR. A side part of the p-type region of the first active-barrier ABR is surrounded by a p$^-$diffused region PPR including a p-type diffused region PR, and the bottom thereof is surrounded by an embedded p-type diffused region PE.

The bottom as well as the left-side part of the p-type region of the first active-barrier is covered by an n-type region of the first active-barrier. A pn-junction region STI includes an epitaxial layer EP, as the n-type region, and the p-type region (a p$^-$diffused region PPR, and the embedded p-type diffused region PE), which is disposed outside of the n-type region.

The present embodiment is substantially identical in configuration to the third embodiment of the invention except for those points described as above, so that, in FIGS. 14, and 15, elements identical to those shown in the third embodiment of the invention are denoted by like reference numerals, omitting repetition in description thereof.

Even if the same pn-junction region STI as shown in FIGS. 10, and 11 is used in place of the trench-isolation structure TI of the semiconductor device according to the third embodiment as in the case of the present embodiment, it is evident that the present embodiment can exhibit the same advantageous effect as shown in the case of the third embodiment.

The semiconductor device according to the sixth embodiment differs only in respective points described as above from the semiconductor device according to the third embodiment. That is, the semiconductor device according to the sixth embodiment is in full conformity with the semiconductor device according to the third embodiment in respect of configuration, condition, procedure, effects, and so forth, which are omitted in the description given as above.

Having described specific embodiments of the invention in the foregoing, it is to be understood that the invention is not limited by any of details of description and that such description is for illustrative purposes only. It is therefore intended that the scope of the invention is defined by the appended claims rather than by the description preceding them, and all changes that fall within meets and bounds of the claims, or equivalence of such meets and bounds are embraced by the claims.

The invention is advantageously applicable to a semiconductor device comprised of an output element including an inductive load, and logic circuits, in particular.

What is claimed is:

1. A semiconductor device comprising:
   a semiconductor substrate including a main surface;
   a first region of a first conductivity type, formed inside the semiconductor substrate;
   an output element including a second region of a second conductivity type, the second region being joined with the first region to form a pn junction;
   an element to be protected, formed over the main surface, over the first region;
   a tap part including a third region of the first conductivity type, formed between the element to be protected and the output element, and formed between the first region and the main surface such that a ground potential is applicable to the first region, and
   a first active-barrier structure formed over the main surface, over the first region, and disposed between the element to be protected and the tap part,
   wherein the first active-barrier structure includes a fourth region of the second conductivity type coupled to the first region, and a fifth region of the first conductivity type in ohmic coupling with the fourth region.

2. The semiconductor device according to claim 1, wherein the fourth region of the first active-barrier structure is disposed in a region closer to the output element than the fifth region.

3. The semiconductor device according to claim 1, further comprising a second active-barrier structure formed over the main surface, over the first region, and disposed between the element to be protected and the output element.

4. The semiconductor device according to claim 3, wherein the second active-barrier structure includes a sixth region of the second conductivity type coupled to the first region, and a seventh region of the first conductivity type in ohmic coupling with the sixth region, and
wherein the seventh region of the second active-barrier structure is disposed in a region closer to the output element than the sixth region.

5. The semiconductor device according to claim 1, further comprising an element isolation structure formed over a portion of the main surface, between the element to be protected and the first active-barrier structure.

6. The semiconductor device according to claim 1, further comprising an element isolation structure formed over the main surface, in such a way as to surround both the element to be protected and the first active-barrier structure, and not to be positioned between the element to be protected and the first active-barrier structure.

7. The semiconductor device according to claim 6, wherein the bottom as well as a side part of a region for forming the element to be protected is surrounded by the fifth region and the element isolation structure.

8. The semiconductor device according to claim 7, wherein the fourth region is positioned between underneath the fifth region and above the first region.

9. The semiconductor device according to claim 5, wherein the element isolation structure includes a groove formed over the main surface, and a dielectric layer embedded in the groove.

10. The semiconductor device according to claim 5, wherein the element isolation structure includes an eighth region of the first conductivity type, ranging from the main surface to the first region.

* * * * *